United States Patent
Buerkle et al.

(10) Patent No.: US 10,494,701 B2
(45) Date of Patent: Dec. 3, 2019

(54) COMPOSITE MATERIAL FOR A SLIDING BEARING

(71) Applicant: KS Gleitlager GmbH, St. Leon-Rot (DE)

(72) Inventors: Gunter Buerkle, Benningen (DE); Mario Witt, Heidelberg (DE); Stepan Kyrsta, Aachen (DE)

(73) Assignee: KS Gleitlager GmbH, St. Leon-Rot (DE)

( * ) Notice: Subject to any disclaimer, the term of this patent is extended or adjusted under 35 U.S.C. 154(b) by 404 days.

(21) Appl. No.: 15/329,854

(22) PCT Filed: Aug. 4, 2015

(86) PCT No.: PCT/EP2015/067916
§ 371 (c)(1),
(2) Date: Jan. 27, 2017

(87) PCT Pub. No.: WO2016/023790
PCT Pub. Date: Feb. 18, 2016

(65) Prior Publication Data
US 2018/0209017 A1    Jul. 26, 2018

(30) Foreign Application Priority Data
Aug. 14, 2014 (EP) .................................. 14181001

(51) Int. Cl.
*F16C 9/02* (2006.01)
*C22C 21/06* (2006.01)
(Continued)

(52) U.S. Cl.
CPC ............ *C22C 21/06* (2013.01); *B32B 15/012* (2013.01); *C22F 1/047* (2013.01); *C23C 14/165* (2013.01);
(Continued)

(58) Field of Classification Search
CPC ....... C22C 21/06; C22C 21/003; C22F 1/047; C22F 1/04; C23C 14/34; C23C 14/165;
(Continued)

(56) References Cited

U.S. PATENT DOCUMENTS 3,950,141 A * 4/1976 Roemer .................. F16C 33/12
428/643
4,452,866 A * 6/1984 Kamiya ................ C22C 21/003
384/912

(Continued)

FOREIGN PATENT DOCUMENTS

EP          2518172        10/2012

OTHER PUBLICATIONS

International Search Report and Written Opinion Form PCT/210, International Application No. PCT/EP2015/067916, pp. 1-7, International Filing Date Aug. 4, 2015, dated Oct. 12, 2016.

*Primary Examiner* — Ryan J. Walters
(74) *Attorney, Agent, or Firm* — Bond Schoeneck & King, PLLC; George McGuire

(57) ABSTRACT

The invention relates to a method for producing a sliding bearing composite material (10), having a support layer (14), in particular made of steel, a bearing metal layer (18) made of a lead-free aluminum base alloy containing magnesium, and a running layer (22), wherein the aluminum base alloy ultimately comprises 0.5-5.5% by weight magnesium, optionally one or more alloy components from the group comprising zinc, copper, silicon, iron, manganese, chromium, titanium, zirconium, vanadium, nickel, cobalt, cerium, and alloy components resulting from impurities, the sum of the latter not exceeding 1% by weight, and the remainder being aluminum, wherein the aluminum base alloy is copper-free or contains at most 3% by weight copper, the total content of zinc, copper, and nickel does not exceed 8% by weight, and the total content of all alloy (Continued)

components does not exceed 12% by weight. The bearing metal layer (18) is either rolled directly onto the support layer (14) or roll-cladded beforehand with an intermediate layer (38) made of an aluminum alloy or technical pure aluminum and then rolled onto the support layer (14) with this intermediate layer (38) in between, in such a way that the intermediate layer (38) subsequently has a thickness of at most 100 µm, in particular at most 50 µm, wherein the composite of the support layer (14) and the bearing metal layer (18) thus obtained is soft-annealed at temperatures between 280° and 350° C. for 2 to 10 hours so that the bearing metal layer of the composite has a Brinell hardness of 50-80 HB 1/5/30. The running layer (22) is subsequently applied galvanically or by means of a PVD method to the bearing metal layer (18).

11 Claims, 4 Drawing Sheets

(51) Int. Cl.
*B32B 15/01* (2006.01)
*C22F 1/047* (2006.01)
*C23C 14/16* (2006.01)
*C23C 14/34* (2006.01)

(52) U.S. Cl.
CPC .............. *C23C 14/34* (2013.01); *F16C 9/02* (2013.01); *F16C 2204/20* (2013.01); *F16C 2204/60* (2013.01)

(58) Field of Classification Search
CPC .... F16C 9/02; F16C 2204/60; F16C 2204/20; B32B 15/012
See application file for complete search history.

(56) References Cited

U.S. PATENT DOCUMENTS

| | | | |
|---|---|---|---|
| 8,771,838 B2* | 7/2014 | Grooteboer | C22C 21/14 |
| | | | 428/654 |
| 2013/0022301 A1* | 1/2013 | Tomikawa | C22C 21/06 |
| | | | 384/278 |
| 2013/0318795 A1* | 12/2013 | Schmitt | C21D 9/40 |
| | | | 29/898.03 |
| 2017/0248167 A1* | 8/2017 | Lindner | B32B 15/012 |

* cited by examiner

COMPOSITE MATERIAL FOR A SLIDING BEARING

CROSS-REFERENCE TO RELATED APPLICATION

This application is the U.S. National Stage filing under 35 U.S.C. 371 of international application number PCT/EP2015/067916, filed on Aug. 4, 2015, the entire disclosure of each of which is incorporated herein by reference.

BACKGROUND OF THE INVENTION

The invention relates to a method for producing a sliding bearing composite material that has a support layer, in particular made of steel, a bearing metal layer made of a lead-free aluminum base alloy containing magnesium, and a running layer. The invention further relates to such a sliding bearing composite material and a sliding bearing element manufactured from same.

Sliding bearing composite materials of this type are known. Typical applications are found in the field of automotive engineering, typically in the area related to internal combustion engines, for example in the manufacture of crankshaft bearing shells and/or connecting rod bearing shells.

Typical sliding bearing composite materials have a support layer made of steel which ensures the mechanical stability and dimensional stability of the sliding bearing composite material. A bearing metal layer is typically applied to the support layer, in particular sintered, cladded, or cast onto the support layer. A running layer is often provided on the bearing metal layer. During use of the sliding bearing, the running layer of a sliding bearing element, which is made of the sliding bearing composite material and shaped in a bending-rolling process, is in contact with a sliding partner.

WO 2010/125026 A1 discloses a sliding bearing composite material of the type mentioned at the outset. For providing the bearing metal layer, it is proposed to use a hardenable aluminum base alloy having a comparatively high copper content of 3.5 to 4.5% by weight copper and 0.1 to 1.5% by weight magnesium in order to achieve a preferred hardness of 70 to 110 HV 0.01 (Vickers hardness). This is achievable due to the high copper content and presumably, solution annealing at high temperatures and subsequent quenching. The bearing metal layer as well as a running layer applied thereto are roll-cladded and have a corresponding thickness.

EP 0 672 840 A1 discloses application of an aluminum-tin-based running layer, exposed to the sliding partner, by roll cladding onto a bearing metal layer; AlZn4SiPb, AlZn4.5Mg, AlSi11CuMgNi, and AlMgSi1 are mentioned. The roll-cladded composite thus obtained is rolled onto a support layer made of steel in a subsequent roll cladding step. For this sliding bearing composite material, in which the hardenable aluminum alloy had a hardness of 60 HV 0.5, the problem was observed that this layer was axially pressed out of the bearing point under heavy load. This problem was addressed in above-cited WO 2010/125026 A1 by further hardening by alloying with large quantities of copper.

SUMMARY OF THE INVENTION

The object of the present invention is to provide a sliding bearing composite material for manufacturing sliding bearing elements, which is intended to have good sliding properties, good mechanical stability, and long-lasting high load capacity. These properties are relevant in particular with regard to use in current automotive engineering, in particular in vehicles having automatic start/stop systems.

This object is achieved according to the invention by a method for manufacturing a sliding bearing composite material of the type mentioned at the outset, wherein the aluminum base alloy ultimately comprises 0.5-5.5% by weight magnesium, optionally one or more alloy components from the group comprising zinc, copper, silicon, iron, manganese, chromium, titanium, zirconium, vanadium, nickel, cobalt, cerium, and alloy components resulting from impurities, the sum of the latter not exceeding 1% by weight, and the remainder being aluminum, wherein the aluminum base alloy is copper-free or contains at most 3% by weight copper, the total content of zinc, copper, and nickel does not exceed 8% by weight, and the total content of all alloy components does not exceed 12% by weight, wherein the bearing metal layer is either rolled directly onto the support layer or roll-cladded beforehand with an intermediate layer made of an aluminum alloy or technical pure aluminum, and then rolled onto the support layer with the intermediate layer in between, in such a way that the intermediate layer subsequently has a thickness of at most 100 µm, in particular at most 50 µm, wherein the composite of the support layer and the bearing metal layer thus obtained is soft-annealed at temperatures between 280° and 350° C. for 2 to 10 hours so that the bearing metal layer of the composite has a Brinell hardness of 50-80 HB 1-5-30, in particular 60-80 HB 1-5-30, and the running layer is subsequently applied galvanically or by a PVD method onto the bearing metal layer.

The bearing metal layer advantageously has a layer thickness of typically 0.2 mm to 0.8 mm. The support layer is typically designed with a layer thickness of 0.5 mm to 4.0 mm. The thickness of the metallic running layer is at most 30 µm, in particular at most 25 µm, in particular at most 20 µm, and at least 5 µm, in particular at least 10 µm, in particular 10-20 µm.

For the sliding bearing composite material produced according to the invention, it was surprisingly found that the bearing metal layer having the composition and treatment according to the invention has unusually high long-term durability. The alloy composition of the bearing metal layer is therefore advantageous for use in sliding bearing composite materials. The rather moderate hardness of the bearing metal layer ensured by the invention, in conjunction with the thin running layer applied galvanically or using the PVD method, makes the sliding bearing composite material fatigue- and corrosion-resistant, and thus suitable for internal combustion engine-related applications in current automotive engineering, in particular for the manufacture of crankshaft bearing shells and connecting rod bearing shells.

It has been found according to the invention that a high level of hardening of the bearing metal layer due to alloying with copper may result in embrittlement, which may adversely affect the fatigue strength. In addition, the use of hardenable aluminum base alloys during roll cladding has proven to be problematic when a softer running layer is already cladded onto the sliding partner. Using the method according to the invention, initially the bearing metal layer is rolled onto the support layer. Subsequently, specifically no solution annealing at high temperatures or subsequent quenching and aging is carried out; instead, the composite thus obtained is soft-annealed at temperatures between 280° and 350° C., in particular between 300° and 350° C. Comparatively large deposits, typically in the range of 1-10 µm, hereby form, and only moderate hardness is achieved in the claimed range. However, it has been shown that such a soft-annealed composite material has long-term stability and retains a high capacity for load, and due to the only moderate hardness has little sensitivity to dirt particles in the oil stream.

The magnesium content of the aluminum base alloy is advantageously 1.5-5.5% by weight, in particular 2.0-5.5% by weight. Magnesium remains at least partially dissolved in the lattice, and forms deposits in some areas. On account of the strain thus created, the moderate hardening and thus an increase in strength are achieved, but which in the soft-annealed state have long-term stability. Due to the fact that the metallic running layer is deposited galvanically or by a PVD method on the composite which is obtained and treated in this way, and is also applied with a smaller thickness compared to the roll cladding method, the structure obtained by the procedure according to the invention is no longer affected, and instead retains its properties that have been set according to the invention. It has been shown that a thin tin- or aluminum-based running layer applied galvanically or by a PVD method, in particular a sputtering method, to the bearing metal layer produced according to the invention has high load capacity and fatigue resistance. The bearing metal layer produced in this way thus forms an excellent base for the running layer. Squeezing or extrusion, i.e., flowing in the axial direction, has not been observed, even under extremely high loads on the sliding bearing composite material produced according to the invention.

In one refinement of the invention, it may prove advantageous when the aluminum base alloy comprises 0.05-7.5% by weight zinc, up to 3.0% by weight copper, in particular up to 2.0% by weight copper, particularly preferably up to 1.0% by weight copper, 0.05-6% by weight silicon, 0.05-0.5% by weight iron, 0.05-1% by weight manganese, 0.05-1% by weight chromium, 0.05-0.5% by weight titanium, 0.05-0.5% by weight zirconium, 0.05-0.5% by weight vanadium, 0.1-3% by weight nickel, 0.1-1% by weight cobalt, and/or 0.05-0.5% by weight cerium. Alloying with one or more of the above-mentioned components in the range of the stated contents may prove to be advantageous with regard to an intended setting of the strength and wear resistance of the sliding bearing composite material according to the invention.

In one advantageous embodiment of the sliding bearing composite material, the aluminum base alloy is an AlMg(2-3) alloy or an AlMg(3-4) alloy or an AlMg(4-5) alloy, optionally containing 0.15-0.35% by weight Cr and/or 0.2-0.5% by weight Mn, optionally containing further alloy components that do not exceed 1% in sum. The stated compositions of the aluminum base alloy have proven to be particularly advantageous for the strength and wear resistance as well as particle compatibility of the sliding bearing composite material according to the invention. The higher the magnesium content, the greater the strength and wear resistance; the lower the magnesium content, the greater the particle compatibility.

The running layer applied by means of a PVD method is advantageously likewise formed on the basis of aluminum, and comprises 5-40% by weight tin and optionally 0.1-5% by weight copper, 0.1-6% by weight silicon, 0.05-1.0% by weight manganese, 0.05-1% by weight chromium, 0.05-0.5% by weight titanium, 0.05-0.5% by weight zirconium, 0.05-0.5% by weight vanadium, 0.1-3% by weight nickel, 0.1-1% by weight cobalt, and/or 0.05-0.5% by weight cerium. A running layer that is applied by means of a PVD method and in particular has the above composition has proven to have particularly good load capacity and little susceptibility to wear in conjunction with a bearing metal layer produced according to the invention.

A sliding bearing composite material has proven to be particularly advantageous in which the running layer is formed by an AlSn(18-27)Cu(0.5-3) alloy, in particular an AlSn(20)Cu(1) alloy or an AlSn(25)Cu(2.5) alloy, and is applied by means of a PVD method. Such a running layer has advantageous tribological properties due to its high tin content. High strength of the running layer is achieved due to the copper content according to the invention. The combination with the bearing metal layer of the sliding bearing composite material according to the invention results in a high load capacity of the sliding bearing composite material.

Within the meaning of the invention, in addition a further layer made of an aluminum base alloy or a copper, cobalt, or nickel base alloy and applied by means of a PVD method is situated between the running layer and the bearing metal layer. Such a further layer may be used as a diffusion barrier, thus increasing the service life of the sliding bearing composite material according to the invention during use.

Within the meaning of the invention, in addition the running layer is a galvanically deposited layer made of bismuth or a bismuth alloy, or tin or a tin-copper alloy, in particular a SnCu(4-8) alloy, in particular a SnCu(6) alloy. Such a running layer has good sliding properties, and at the same time has high strength and a long service life. Moreover, galvanic coatings are inexpensive and achievable using automated procedures.

Within the meaning of the invention, in addition a first intermediate layer based on nickel, copper, or cobalt is situated between such a galvanically deposited running layer just described and the bearing metal layer.

Within the meaning of the invention, in addition a second intermediate layer based on tin-nickel or tin-copper or tin-cobalt is situated between the galvanically deposited running layer according to the invention and the first intermediate layer. Such a second intermediate layer may act as a diffusion barrier layer, thus increasing the service life of the sliding bearing composite material.

The intermediate layers, which in each case may be situated between the bearing metal layer and the running layer that is deposited by the PVD method or galvanically, typically have layer thicknesses between 1 and 4 μm. They are likewise applied by the PVD method or galvanically.

It is noted that technical pure aluminum is understood to mean a material that contains 99.5% by weight aluminum and only a maximum of 0.5% by weight of components resulting from impurities.

The thin running layer preferably has a thickness of at most 30 μm, in particular at most 25 μm, in particular at most 20 μm, and at least 5 μm, in particular at least 10 μm, and particularly preferably 10-20 μm.

The subject matter of the invention further relates to a sliding bearing composite material, having the features of claim 12, that is produced by the method according to the invention. Protection is also claimed for a sliding bearing composite material in which a bearing metal layer having the composition stated in claim 12 is rolled onto a support layer, and has a Brinell hardness of 50-80 HB 1/5/30, in particular 60-80 HB 1/5/30, wherein a metallic running layer having a thickness of at most 30 μm is applied to this composite galvanically or by a PVD method, either directly onto the bearing metal layer or onto one or more very thin intermediate layers having a thickness of 1 to 4 μm.

Also within the meaning of the invention is a sliding bearing element, in particular a sliding bearing shell, in particular a crankshaft bearing shell or a connecting rod bearing shell, which is characterized in that it contains or is manufactured from the sliding bearing composite material according to the invention. The use of such a sliding bearing element is suitable in particular for internal combustion engine-related sliding bearing functions in current automotive engineering. Applications arise here which impose high demands on tribological and mechanical properties of the sliding bearing elements used, in particular for current high-performance engines with automatic start/stop systems. These demands may be met by using the sliding bearing element according to the invention, based on the sliding bearing composite material according to the invention.

Further features, particulars, and advantages of the invention result from the appended patent claims, the illustrations in the drawings, and the following description of multiple preferred embodiments of the sliding bearing composite material according to the invention and of the sliding bearing element according to the invention.

The drawings show the following:

DETAILED DESCRIPTION

Figure 1:
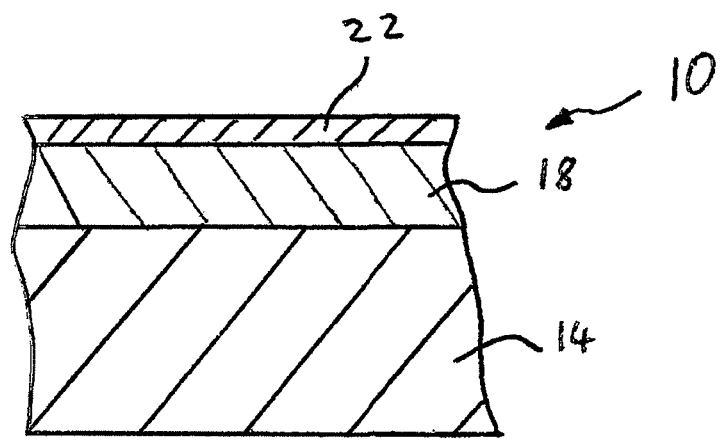
FIG. 1 shows a schematic sectional view, not true to scale, of a sliding bearing composite material according to the invention.

FIG. 1 shows a schematic sectional view, not true to scale, of a sliding bearing composite material 10 according to the invention for the manufacture of sliding bearing elements, in particular sliding bearing shells, in a bending process. The sliding bearing composite material 10 comprises a support layer 14 preferably made of steel. A bearing metal layer 18 having the composition stated in the introduction to the description is rolled on, i.e., applied in a roll cladding method, on a side of the support layer 14 facing a sliding partner. A thin running layer 22 having the composition and thickness stated in the introduction to the description is applied galvanically or by a PVD method to the bearing metal layer 18.

Figure 2:
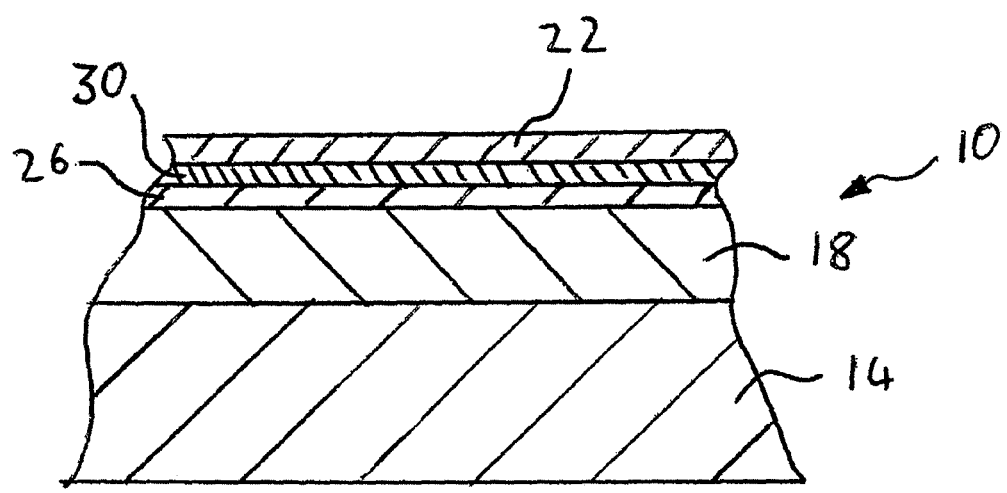
FIG. 2 shows a schematic sectional view, not true to scale, of another embodiment of a sliding bearing composite material according to the invention.

FIG. 2 shows a schematic sectional view, not true to scale, of a sliding bearing composite material 10 according to the invention. In the exemplary embodiment shown in FIG. 2, the running layer 22 is designed as a galvanically deposited layer. In this exemplary embodiment, a first intermediate layer 26 having the composition stated in the introduction to the description is situated between the bearing metal layer 18 and the running layer 22. A second intermediate layer 30 having the composition stated in the introduction to the description is situated between the first intermediate layer 26 and the running layer 22. Both intermediate layers are galvanically applied, and have a small thickness of preferably only 1-4 μm.

Figure 3:
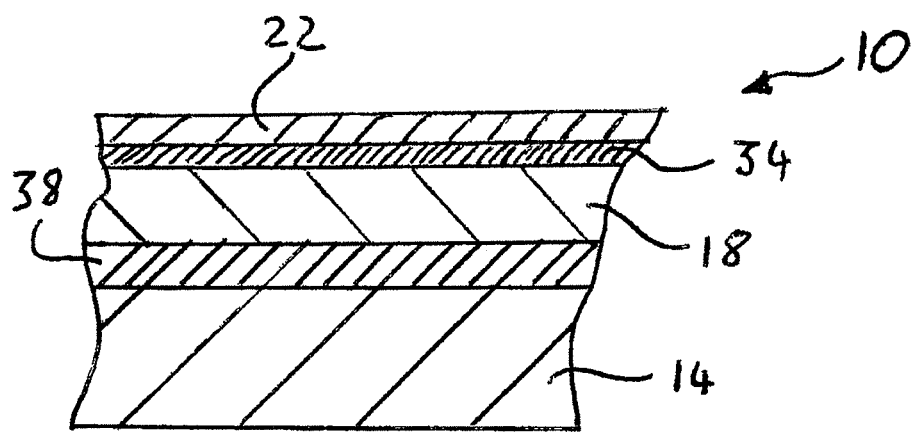
FIG. 3 shows a schematic sectional view, not true to scale, of another embodiment of a sliding bearing composite material according to the invention.

FIG. 3 shows a schematically illustrated sectional view, not true to scale, of a sliding bearing composite material 10 according to the invention. In the exemplary embodiment shown in FIG. 3, the running layer 22 is designed as a layer that has the composition stated in the introduction to the description and that is applied by a PVD method, typically sputtered. A further layer 34 that has the composition stated in the introduction to the description and that is applied by means of a PVD method is situated between the running layer 22 and the bearing metal layer 18.

An intermediate layer 38 is situated between the bearing metal layer 18 and the support layer 14. In this exemplary embodiment, the intermediate layer 38 is designed in the form of an aluminum alloy, but within the meaning of the invention may also be made of pure aluminum. A layered structure having no intermediate layer 38 is likewise within the meaning of the invention. For the manufacture, the bearing metal layer 18 and the intermediate layer 38 are roll-cladded to one another. The composite made up of the bearing metal layer 18 and the intermediate layer 38 is subsequently cladded onto the support layer 14, which is easily possible due to the fact that the intermediate layer 38 is softer than the bearing metal layer 18.

In the exemplary embodiments shown in FIGS. 1 through 3, in each case the bearing metal layer 18 with its composition according to the invention forms a solid base with only moderate hardness for the running layer 22. This composite allows high load on the running layer 22, at the same time with a long service life of the sliding bearing composite material 10.

Figure 4:
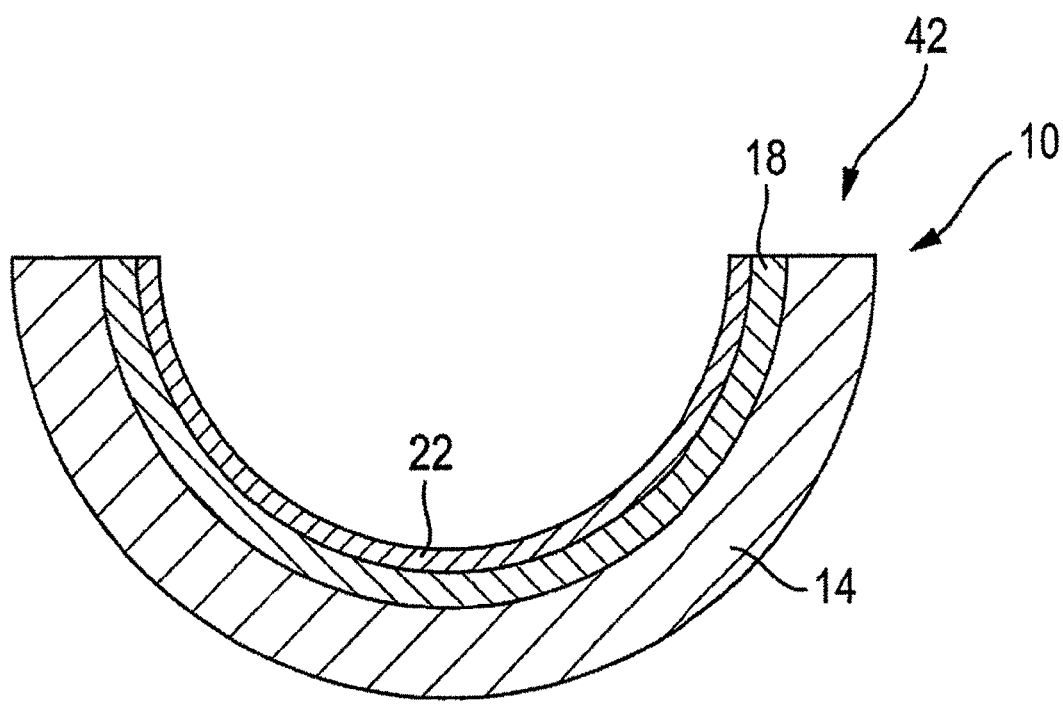
FIG. 4 shows a schematic sectional view, not true to scale, of a connecting rod bearing shell that includes a sliding bearing composite material according to the invention.

FIG. 4 shows a schematically illustrated sectional view, not true to scale, of a sliding bearing shell 42 according to the invention. Such a sliding bearing shell may be manufactured from the sliding bearing composite material according to the invention 10 by means of roll bending, for example.

The invention claimed is:

1. A method for producing a sliding bearing composite material comprising the steps of:
    a. providing a support layer made of steel, a bearing metal layer made of a lead-free aluminum base alloy containing magnesium, and a running layer, wherein the aluminum base alloy comprises 0.5-5.5% by weight magnesium, at least one alloy component selected from the group comprising zinc, copper, silicon, iron, manganese, chromium, titanium, zirconium, vanadium, nickel, cobalt, cerium, and alloy components resulting from impurities, the sum of the latter not exceeding 1% by weight, and the remainder being aluminum, wherein the aluminum base alloy is contains 0-3% by weight copper, the total content of zinc, copper, and nickel does not exceed 8% by weight, and the total content of all alloy components does not exceed 12% by weight, wherein the bearing metal layer is produced by one of:
        i. rolling directly onto the support layer and soft-annealing the support layer and the bearing metal layer at temperatures between 280° and 350° C. for 2 to 10 hours so that the bearing metal layer has a Brinell hardness of 50-80 HB 1/5/30, and applying the running layer to the bearing metal layer by one of: galvanically or by means of a PVD method, or
        ii. roll-cladding beforehand with an intermediate layer made of one of: an aluminum alloy or technical pure aluminum, and then rolling onto the support layer, with this intermediate layer in between such that the intermediate layer has a thickness of at most 100 μm, and soft-annealing the support layer and the bearing metal layer at temperatures between 280° and 350° C. for 2 to 10 hours so that the bearing metal layer has a Brinell hardness of 50-80 HB 1/5/30, and applying the running layer to the bearing metal layer by one of: galvanically or by means of a PVD method.

2. The method according to claim 1, characterized in that the aluminum base alloy comprises one or more of the following alloy components: 0.05-7.5% by weight zinc, up to 3% by weight copper, 0.05-6% by weight silicon, 0.05-0.5% by weight iron, 0.05-1% by weight manganese, 0.05-1% by weight chromium, 0.05-0.5% by weight titanium, 0.05-0.5% by weight zirconium, 0.05-0.5% by weight vanadium, 0.1-3% by weight nickel, 0.1-1% by weight cobalt, and/or 0.05-0.5% by weight cerium.

3. The method according to claim 1, characterized in that the aluminum base alloy comprises 1.5-5.5% by weight magnesium.

4. The method according to claim 1, characterized in that the aluminum base alloy having 2-3% by weight magnesium or an aluminum alloy having 3-4% by weight magnesium, or an aluminum alloy having 4-5% by weight magnesium, containing 0.15-0.35% by weight Cr and/or 0.2-0.5% by weight Mn, containing further alloy components that do not exceed 1% in sum.

5. The method according to claim 1, characterized in that the running layer is a layer that is applied by means of a PVD method, and that is formed on an Al basis with 5-40% by weight tin and optionally includes 0.1-5% by weight copper, 0.1-6% by weight silicon, 0.05-1% by weight manganese, 0.05-1% by weight chromium, 0.05-0.5% by weight titanium, 0.05-0.5% by weight zirconium, 0.05-0.5% by weight vanadium, 0.1-3% by weight nickel, 0.1-1% by weight cobalt, and/or 0.05-0.5% by weight cerium.

6. The method according to claim 5, characterized in that the running layer is formed by an aluminum alloy having 18-27% weight tin and 0.5-3% copper.

7. The method according to claim 5, characterized in that a further layer made of an aluminum base alloy or a copper, cobalt, or nickel base alloy and applied by means of a PVD method is situated between the running layer and the bearing metal layer.

8. The method according to claim 1, characterized in that the running layer is a galvanically deposited layer made of bismuth or a bismuth alloy, or tin or a tin-copper alloy.

9. The method according to claim 8, characterized in that the intermediate layer based on nickel, copper, or cobalt is situated between the running layer and the bearing metal layer.

10. The sliding bearing composite material according to claim 9, characterized in that a second intermediate layer based on tin-nickel or tin-copper or tin-cobalt is situated between the running layer and the intermediate layer.

11. The method according to claim 1, characterized in that the thickness of the running layer is at most 30 μm.

* * * * *